US009524806B2

(12) United States Patent
Jeong et al.

(10) Patent No.: US 9,524,806 B2
(45) Date of Patent: Dec. 20, 2016

(54) HYBRID TRANSPARENT CONDUCTING MATERIALS

(75) Inventors: Changwook Jeong, West Lafayette, IN (US); Mark Lundstrom, Lafayette, IN (US); Muhammad Ashraful Alam, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 13/368,000

(22) Filed: Feb. 7, 2012

(65) Prior Publication Data

US 2013/0200421 A1 Aug. 8, 2013

(51) Int. Cl.
| | |
|---|---|
| *H01B 1/04* | (2006.01) |
| *B32B 9/00* | (2006.01) |
| *B32B 3/12* | (2006.01) |
| *B32B 15/04* | (2006.01) |
| *H01L 31/0224* | (2006.01) |
| *H01B 1/02* | (2006.01) |
| *B82Y 30/00* | (2011.01) |

(52) U.S. Cl.
CPC . *H01B 1/04* (2013.01); *B32B 3/12* (2013.01); *B32B 9/007* (2013.01); *B32B 15/04* (2013.01); *H01B 1/02* (2013.01); *H01L 31/022466* (2013.01); *B32B 2262/103* (2013.01); *B32B 2307/202* (2013.01); *B32B 2307/704* (2013.01); *B32B 2311/08* (2013.01); *B32B 2313/04* (2013.01); *B82Y 30/00* (2013.01)

(58) Field of Classification Search
CPC ............... B32B 3/10; B32B 3/12; B32B 5/02; B32B 5/022; B32B 15/00; B32B 15/02; B32B 15/04; B32B 9/007; B32B 2262/103; B32B 2264/105; B32B 2307/20;B32B 2307/202; B32B 2307/412; B32B 2307/704; B32B 2311/00; B32B 2311/02; B32B 2311/08; B32B 2313/04; C01B 31/0438–31/0492; C01B 2204/00; C01B 2204/02; C01B 2204/20; C01B 2204/22; B82Y 30/00; H01L 31/022466; H01B 1/04; H01B 1/02
USPC ...... 428/292.1, 408, 293.4, 294.4, 323, 340, 428/364, 401, 903; 977/762–777, 734; 252/502, 503, 512, 514; 423/448
See application file for complete search history.

(56) References Cited

U.S. PATENT DOCUMENTS

| | | | |
|---|---|---|---|
| 7,642,463 | B2 | 1/2010 | Guiheen et al. |
| 8,363,201 | B2 | 1/2013 | O'Rourke et al. |

(Continued)

OTHER PUBLICATIONS

Dictionary.com, "in", accessed Apr. 7, 2014.*

(Continued)

*Primary Examiner* — Jennifer Chriss
*Assistant Examiner* — Frank Vineis
(74) *Attorney, Agent, or Firm* — Barnes & Thornburg LLP

(57) ABSTRACT

Illustrative embodiments of hybrid transparent conducting materials and applications thereof are disclosed. In one illustrative embodiment, a hybrid transparent conducting material may include a polycrystalline film and a plurality of conductive nanostructures randomly dispersed in the polycrystalline film. In another illustrative embodiment, a photovoltaic cell may include a transparent electrode comprising polycrystalline graphene that is percolation doped with metallic nanowires, where the metallic nanowires do not form a percolation network for charge carriers across the transparent electrode.

16 Claims, 10 Drawing Sheets

(56) References Cited

U.S. PATENT DOCUMENTS

| | | | |
|---|---|---|---|
| 2003/0044608 | A1 | 3/2003 | Yoshizawa et al. |
| 2006/0003188 | A1* | 1/2006 | Ohno ................. C23C 14/0021 428/701 |
| 2006/0060839 | A1* | 3/2006 | Chandross et al. ............. 257/40 |
| 2007/0228439 | A1* | 10/2007 | Duan et al. .................... 257/296 |
| 2007/0284557 | A1 | 12/2007 | Gruner et al. |
| 2008/0259262 | A1* | 10/2008 | Jones ..................... B82Y 10/00 349/139 |
| 2010/0178417 | A1 | 7/2010 | Connor et al. |
| 2012/0263939 | A1 | 10/2012 | Tao et al. |
| 2012/0327024 | A1 | 12/2012 | Veerasamy |
| 2013/0048339 | A1* | 2/2013 | Tour et al. ................. 174/126.1 |
| 2013/0062796 | A1 | 3/2013 | Coughlin |
| 2013/0078449 | A1 | 3/2013 | Naito et al. |
| 2014/0014171 | A1* | 1/2014 | Alam et al. ................... 136/256 |

OTHER PUBLICATIONS

Fan, G "Graphene/Silicon Nanowire Schottky Junction for Enhanced Light Harvesting", Feb. 16, 2011, ACS Appl. Mater. Interfaces 2011, 3, 721-725.*

Thefreedictionary.com, "On", accessed Nov. 6, 2014.*

Chen, R., "Co-Percolating Graphene-Wrapped Silver Nanowire Network for High Performance, Highly Stable, Transparent Conducting Electrodes", Adv. Funct. Mater. Apr. 25, 2013, 23, 5150-5158.*

STN Search History, Nov. 6, 2014.*

Zeng, X. "A New Transparent Conductor: Silver Nanowire Film Buried at the Surface of a Transparent Polymer", Adv. Mater. Aug. 3 2010, 22, 4484-4488 and Supplemental pp. 1-7.*

Wassei J., Graphene, a promising transparent conductor, Materials Today, vol. 13, Issue 3, Mar. 2010, pp. 52-59, ISSN 1369-7021, http://dx.doi.org/10.1016/S1369-7021(10)70034-1.*

Bae, S. Roll-to-roll production of 30-inch graphene films for transparent electrodes Nature Nanotechnology 5, 574-578 (2010) doi:10.1038/nnano.2010.132 Published online Jun. 25, 2010.*

Muller, D., Grains and grain boundaries in single-layer graphene atomic patchwork quilts, Nature 469, 389-392 (Jan. 20, 2011) doi:10.1038/nature09718, Jan. 5, 2011.*

Ma, H., A study of indium tin oxide thin film deposited at low temperature using facing target sputtering system, Surface and Coatings Technology, vol. 153, Issues 2-3, Apr. 15, 2002, pp. 131-137, ISSN 0257-8972.*

Jeong et al., "Prospects for Nanowire-Doped Polycrystalline Graphene Films for Ultratransparent, Highly Conductive Electrodes," Nano Letters, Oct. 10, 2011, pp. 5020-5025, vol. 11.

Kyrylyuk et al., "Controlling Electrical Percolation in Multicomponent Carbon Nanotube Dispersions," Nature Nanotechnology, Apr. 10, 2011, pp. 364-369, vol. 6.

Lee et al., "Solution-Processed Metal Nanowire Mesh Transparent Electrodes," Nano Letters, Jan. 12, 2008, pp. 689-692, vol. 8.

Wu et al., "Electrospun Metal Nanofiber Webs as High-Performance Transparent Electrode," Nano Letters, Aug. 25, 2010, pp. 4242-4248, vol. 10.

Zhu et al., "Rational Design of Hybrid Graphene Films for High-Performance Transparent Electrodes," ACS Nano, Jul. 20, 2011, pp. 6472-6479, vol. 5.

Chen et al., "Co-Percolating Graphene-Wrapped Silver Nanowire Network for High Performance, Highly Stable, Transparent Conducting Electrodes," Advanced Functional Materials, Apr. 25, 2013, pp. 5150-5158, vol. 23.

Kumar et al., "Performance of Carbon Nanotube-Dispersed Thin-Film Transistors," Applied Physics Letters, 2006, pp. 143501-1 to 143501-3, vol. 89.

Bo et al., "Carbon Nanotubes-Semiconductor Networks for Organic Electronics: The Pickup Stick Transistor," Applied Physics Letters, 2005, pp. 182102-1 to 182102-3, vol. 86.

Zhu, Rui et al. "Fused Silver Nanowires with Metal Oxide Nanoparticles and Organic Polymers for Highly Transparent Conductors" ACSNANO. vol. 5, No. 12. pp. 9877-9882 (2011).

Lee, Jinhwan et al. "Room-Temperature Nanosoldering of a Very Long Metal Nanowire Network by Conducting-Polymer-Assisted Joining for a Flexible Touch-Panel Application" Advanced Functional Materials. (2013).

Hu, Liangbing et al. "Scalable Coating and Properties of Transparent, Flexible, Silver Nanowire Electrodes" ACSNANO. vol. 4, No. 5. pp. 2955-2963 (2010).

Madaria, Anuj et al. "Uniform, Highly Conductive, and Patterned Transparent Films of a Percolating Silver Nanowire Network on Rigid and Flexible Substrates Using a Dry Transfer Technique" Nano Research. Nano Res (2010) 3: pp. 564-573.

Madaria, Anuj et al. "Large Scale, Highly Conductive and Patterned Transparent Films of Silver Nanowires on Arbitrary Substrates and Their Application in Touch Screens" Nanotechnology, 22. (2011).

Gaynor, Whitney et al. "Smooth Nanowire/Polymer Composite Transparent Electrodes" Advanced Materials 23, pp. 2905-2910 (2011).

De, Sukanta et al. "Silver Nanowire Networks as Flexible, Transparent, Conducting Films: Extremely High DC to Optical Conductivity Ratios" ACSNANO. vol. 3, No. 7, pp. 1767-1774 (2009).

Kholmanov, Iskandar et al. "Reduced Graphene Oxide/Copper Nanowire Hybrid Films as High-Performance Transparent Electrodes" ACSNANO. vol. 7, No. 2, pp. 1811-1816 (2013).

Kholmanov, Iskandar et al. "Improved Electrical Conductivity of Graphene Films Integrated with Metal Nanowires" American Chemical Society. Nano Lett. 2012, 12 pp. 5679-5683.

Moon, In et al. "2D Graphene Oxide Nanosheets as an Adhesive Over-Coating Layer for Flexible Transparent Conductive Electrodes" Scientific Reports. (2013).

Chen, Jian et al. "Highly Conductive and Flexible Paper of 1D Silver-Nanowire-Doped Graphene" American Chemical Society. ACS Appl. mater. Interfaces 2013, 5, pp. 1408-1413.

* cited by examiner

HYBRID TRANSPARENT CONDUCTING MATERIALS

BACKGROUND

The present disclosure relates, generally, to transparent conducting materials ("TCMs") and, more particularly, to hybrid TCMs including a polycrystalline film that is "percolation doped" with conductive nanostructures.

Since resistivity and transmittance are often fundamentally constrained by the intrinsic properties of a material, developing TCMs with both low sheet resistance (e.g., $R_S<10$ Ω/sq) and high transmittance (e.g., T>90%) has been a persistent challenge. Various metal-doped oxides, such as indium tin oxide ("ITO"), are currently used in many commercial applications. A suitable replacement for ITO is desired, however, for at least the following reasons: the limited availability and high-cost of indium, increasing brittleness with aging, chemical instability under acid/base conditions, poor transmittance in the near infrared, and/or metallic-ion diffusion from ITO into thin barrier layers that may result in parasitic leakage. These and other problems make ITO-based technologies non-ideal for applications such as thin-film photovoltaics ("PVs"), flexible electronics, touch-screen displays, light emitting diodes, and the like.

Various alternative TCMs have been explored, including, by way of example, networks of carbon nanotubes ("CNTs"), networks of metal nanowires ("NWs"), and chemical vapor deposited ("CVD") polycrystalline graphene ("poly-graphene" or "PG") films. While these potential ITO replacements each resolve several practical issues associated with ITO, their respective $R_S$-T curves are not significantly different from that of ITO (as shown in FIG. 9). For instance, to achieve technologically relevant sheet resistance values (e.g., $R_S<20$ Ω/sq), the density of a network of CNTs or NWs must significantly exceed the percolation threshold. These high densities of CNTs or NWs, however, reduce the transmittance of such TCMs considerably. Moreover, even with low $R_S$, vertical current collection in PV cells is compromised by current crowding at the small-area interface between a network of CNTs or NWs and the bulk emitter layer. Meanwhile, experimental data suggests that there is a fundamental limitation to the sheet resistance and transmittance of pure poly-graphene films, making it difficult for poly-graphene to compete successfully with ITO.

SUMMARY

According to one aspect, a hybrid transparent conducting material (TCM) may comprise a polycrystalline film and a plurality of conductive nanostructures randomly dispersed in the polycrystalline film. The polycrystalline film may comprise a polycrystalline graphene film. The plurality of conductive nanostructures may comprise a plurality of metallic nanowires. The plurality of metallic nanowires may comprise silver nanowires. The plurality of conductive nanostructures may each have a length greater than 1 μm and a cross-sectional dimension of less than 1 μm.

In some embodiments, a density of the plurality of conductive nanostructures randomly dispersed in the polycrystalline film may be below a percolation threshold. In other embodiments, the density of the plurality of conductive nanostructures randomly dispersed in the polycrystalline film may be at most sixty percent of the percolation threshold. An average length of the plurality of conductive nanostructures may be greater than an average grain diameter of the polycrystalline film. An average distance between each of the plurality of conductive nanostructures may be greater than the average length of the plurality of conductive nanostructures. The hybrid TCM may have a sheet resistance below twenty ohms per square and a transmittance above ninety percent for solar radiation.

According to another aspect, a hybrid TCM may comprise a polycrystalline film including a number of grains and a number of conductive nanostructures randomly dispersed in the polycrystalline film, where the number of conductive nanostructures is less than one half the number of grains. The polycrystalline film may comprise a polycrystalline graphene film. The conductive nanostructures may comprise metallic nanowires. The metallic nanowires may comprise silver nanowires.

In some embodiments, the conductive nanostructures do not form a percolating network for charge carriers in the polycrystalline film. An average length of the conductive nanostructures may be greater than an average grain diameter of the grains of the polycrystalline film. The number of conductive nanostructures may be less than one fourth the number of grains. The hybrid TCM may have a sheet resistance below twenty ohms per square and a transmittance above ninety percent for solar radiation.

According to yet another aspect, a photovoltaic cell may comprise a transparent electrode comprising polycrystalline graphene that is percolation doped with metallic nanowires, where the metallic nanowires do not form a percolation network for charge carriers across the transparent electrode.

In some embodiments, the transparent electrode may comprise a plurality of stacked layers, where each of the plurality of stacked layers comprises polycrystalline graphene that is percolation doped with metallic nanowires. The transparent electrode may have a sheet resistance below twenty ohms per square and a transmittance above ninety percent for solar radiation.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION OF THE DRAWINGS

Figure 1A:
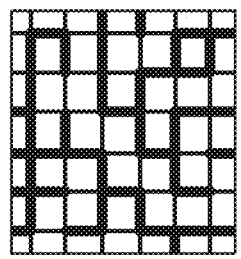
FIG. 1A illustrates one embodiment of a poly-graphene microstructure having uniform square grains ("square").

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and appended claims.

References in the specification to "one embodiment," "an embodiment," "an illustrative embodiment," etcetera, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, specific arrangements or orderings of schematic elements may be shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

The present disclosure relates to hybrid TCMs including a polycrystalline film (e.g., a poly-graphene film) that is "percolation doped" with conductive nanostructures (e.g., metallic NWs). An experimentally calibrated, comprehensive numerical model for electron transport in poly-graphene was used to determine that the high resistivity of pure poly-graphene films reflects an intrinsic percolation bottleneck, in which electrons are periodically trapped in domains formed by high-resistance grain boundaries ("GBs"). As used in the present disclosure, "percolation doping" refers to the inclusion of conductive nanostructures in a polycrystalline film, at a density below a percolation threshold, to improve conductivity by creating conducting pathways that bridge high-resistance GBs in the polycrystalline film. The continuity of the polycrystalline film in such a hybrid TCM ensures vertical current collection free from current crowding, while the relatively low density of conductive nanostructures ensures that the high transmittance of the polycrystalline film is not compromised. As further described below, a hybrid TCM including a polycrystalline film that is percolation doped with conductive nanostructures may achieve both low sheet resistance (e.g., $R_S$<20 Ω/sq) and high transmittance (e.g., T>90%)—performance comparable to, or better than, ITO. Although the illustrative embodiments described below are described primarily with reference to a poly-graphene film, it is contemplated that any polycrystalline material may similarly benefit from percolation doping with conductive nanostructures.

Figure 1B:
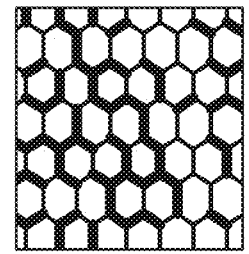
FIG. 1B illustrates one embodiment of a poly-graphene microstructure having uniform hexagonal grains ("hex1").
Figure 1C:
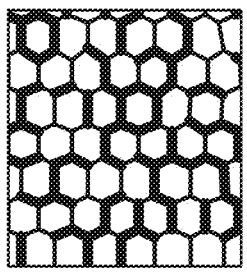
FIG. 1C illustrates one embodiment of a poly-graphene microstructure having perturbed hexagonal grains with Gaussian size distribution ("hex2").
Figure 1D:
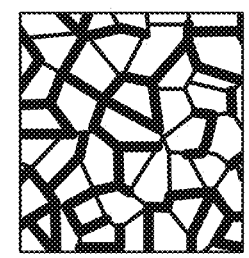
FIG. 1D illustrates one embodiment of a poly-graphene microstructure having random grains with normal size distribution ("rand1").
Figure 1E:
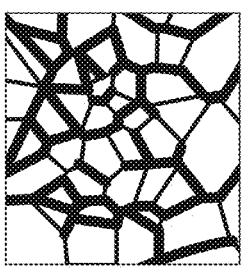
FIG. 1E illustrates one embodiment of a poly-graphene microstructure having random grains with log-normal size distribution ("rand2").
Figure 2A:
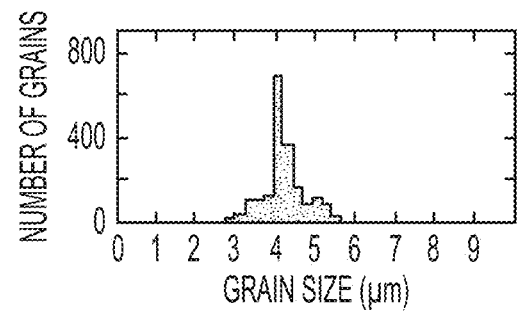
FIG. 2A illustrates a grain size distribution for the poly-graphene microstructure of FIG. 1C.
Figure 2B:
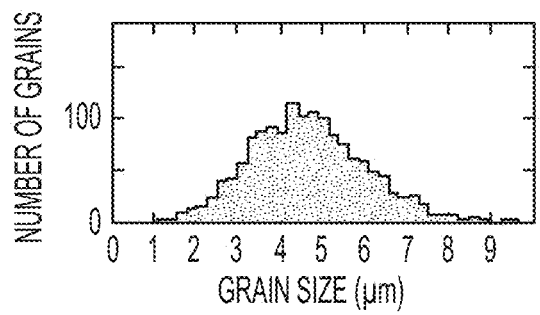
FIG. 2B illustrates a grain size distribution for the poly-graphene microstructure of FIG. 1D.
Figure 2C:
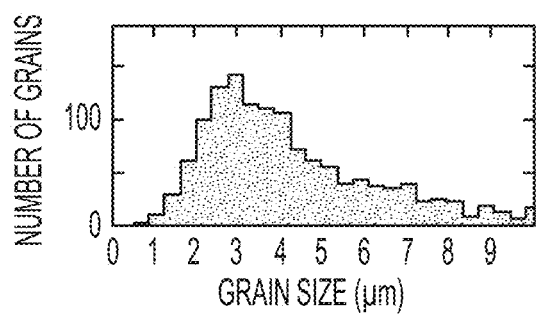
FIG. 2C illustrates a grain size distribution for the poly-graphene microstructure of FIG. 1E.

To better understand the resistivity of poly-graphene, a process model was used to produce representative structures, an electrical model was used to compute sheet resistances, and an optical model was used to compute transmittances. First, polycrystalline graphene samples were synthetically generated using Voronoi tessellation. In this algorithm, input parameters (e.g., the pattern and number of seed sites) were used to control statistical features of the resulting Voronoi cells (e.g., shape, size, statistical distributions, etcetera). This approach allowed the generation of a wide variety of film morphologies characteristic of various deposition conditions and captured the universal features of carrier transport in poly-graphene films, independent of the details of film deposition. Five types of microstructures with increasing complexity were used to represent grain-size distributions in poly-graphene films: uniform square grains as a reference structure ("square," illustrated in FIG. 1A), uniform hexagonal grains to approximate poly-graphene films produced by a seeded growth method ("hex1," illustrated in FIG. 1B), perturbed hexagonal grains with Gaussian size distribution typical of poly-graphene films produced by a seeded growth method ("hex2," illustrated in FIG. 1C), random grains with normal size distribution to approximate CVD poly-graphene films ("rand1," illustrated in FIG. 1D), and random grains with log-normal size distribution typical of CVD poly-graphene ("rand2," illustrated in FIG. 1E). Corresponding grain size distributions for the "hex2," "rand1," and "rand2" microstructures are illustrated in FIG. 2A, FIG. 2B, and FIG. 2C, respectively. In each of the five types of microstructures, the average grain size (i.e., the average grain diameter, $<L_{grain}>$) was ~5 μm (consistent with reported values). Several hundred samples of the foregoing microstructures were synthetically generated for statistical study of the transport characteristics of poly-graphene films.

Two important electrical parameters for polycrystalline films are the resistances of the grains (i.e., inter-grain resistances) and of the GBs (i.e., intra-grain resistances). In poly-graphene, it is experimentally observed that ratio between these resistances typically ranges from ~1 to ~30. Although the GBs may exhibit a distribution of resistances (as a function of misorientation between neighboring grains), for simplicity, each GB is classified as either a high-resistance GB or a low-resistance GB in the present disclosure. In the illustrative microstructures shown in FIGS. 1A-E, approximately half of the GBs are classified as high-resistance GBs (lines of heavier weight), and approximately half of the GBs are classified as low-resistance GBs (lines of lighter weight). In other words, the percentage of high-resistance GBs, $P_{GB}$, is about 50% in these microstructures.

A drift-diffusion formulation may be used to describe electronic transport through the microstructures described above: $J=\sigma \cdot \nabla(F_n/q)$, where J is the current density in A/m, $\sigma$ is the sheet conductivity, and $F_n$ is the electrochemical potential. This drift-diffusion formulation is appropriate because the average grain size (~5 μm) is much larger than the typical mean-free path (hundreds of nanometers). Assuming charge current is conserved (i.e., no recombination-generation), $\nabla \cdot J=0$ may be solved.

Figure 5:
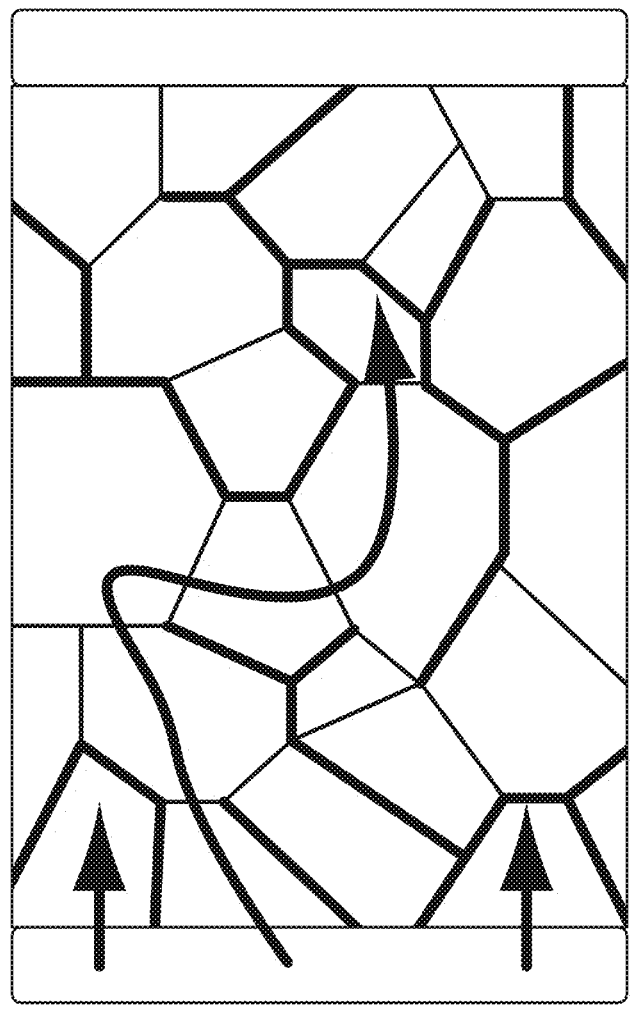
FIG. 5 illustrates the percolation of charge carriers through a poly-graphene film including high-resistance and low-resistance GBs.

Within the bulk of a poly-graphene grain, $\sigma=\sigma_0$. The theoretical lower limit of sheet resistance is 30 Ω/sq, which occurs when only acoustic deformation potential scattering is present. A low-resistance GB may characterized as being perfectly transparent to charge carriers (i.e., $\sigma_{GB}^{(lo)} \equiv \sigma_0$). A high-resistance GB may be characterized by a transport energy gap ($E_G$) below which charge carriers are perfectly reflected (i.e., $\sigma_{GB}^{(hi)} < \sigma_0$). With these three conductivities, i.e., $\sigma_0$, $\sigma_{GB}^{(lo)}$, $\sigma_{GB}^{(hi)}$, the transport problem is fully defined. The foregoing model of high and low resistance GBs leads to a maze-like morphology landscape through which a charge carrier injected from one contact travels to the other contact (as further described below with reference to FIG. 5), thereby transforming electronic transport in poly-graphene into a percolation problem.

Figure 1F:
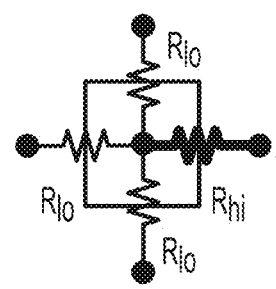
FIG. 1F illustrates a simplified one-node model for the uniform square grains of FIG. 1A.

For each of the microstructures discussed above, the finite difference method ("FDM") was used to calculate electronic transport properties (with each grain having about 200 nodes). The input parameters used for the FDM calculations were the sheet resistance within the grains ($R_{lo} \approx 30$ Ω/sq) and the sheet resistance across high-resistance GBs ($R_{hi} \approx 63 R_{lo}$). The FDM results were compared to a simple "one-node model" in which each grain was represented by only one node. For the illustrative microstructure of FIG. 1A, the one-node model is shown schematically in FIG. 1F, where the sheet resistance across each low-resistance GB and the sheet resistance across each high-resistance GB are denoted as $R_{lo}$ and $R_{hi}$, respectively. The high-resistance and low-resistance GBs in this one-node model can be easily measured.

Figure 3:
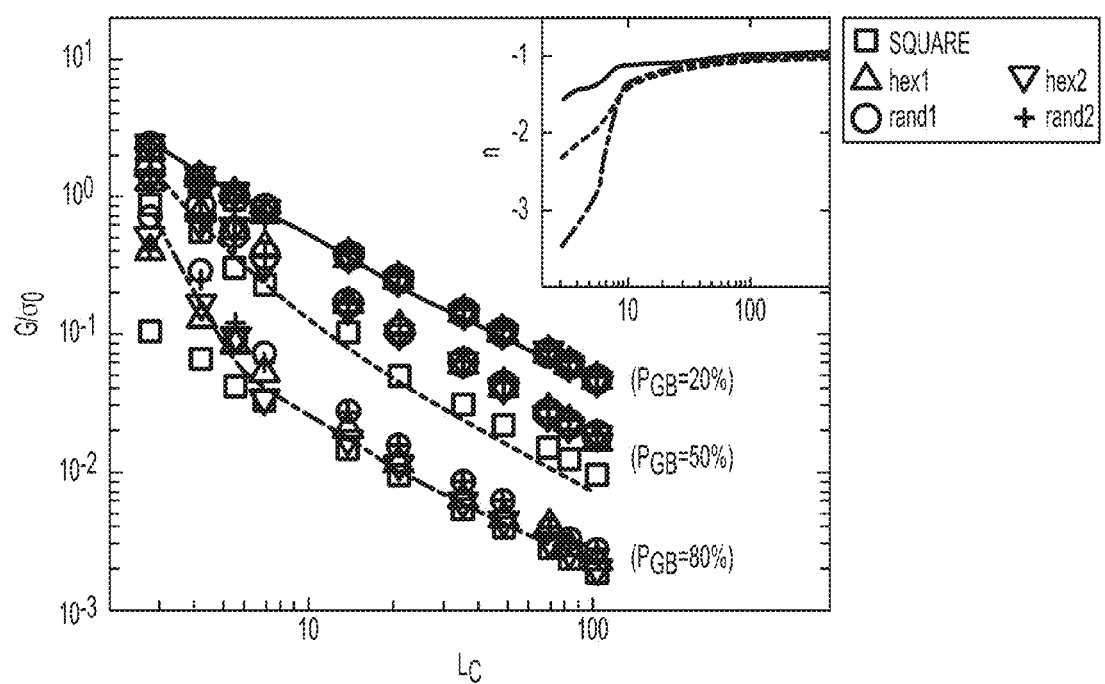
FIG. 3 is a graph of normalized sheet conductance for the poly-graphene microstructures of FIGS. 1A-E as a function of sample length, for three different percentages of high-resistance grain boundaries ("GBs").

The normalized sheet conductance, $G/\sigma_0$, for each of the microstructures discussed above is plotted in FIG. 3 as a function of the sample length, $L_C$, for three different percentages of high-resistance GBs ($P_{GB}$=20%, 50%, and 80%). The sample width was fixed at seven times the average grain size, after which the width dependence of the electronic transport properties disappears (as one of ordinary skill would expect for large area films). The inset of FIG. 3 shows the dependence of the conductance exponent, n, on the sample length, i.e., $G \propto (L_C)^n$, for the three different percentages of high-resistance GBs. If the sample length is smaller than about ten times the average grain size, the conductance exponent becomes significantly larger than −1.0, indicating a nonlinear dependence on sample length. Thus, as compared to a longer sample, there is a higher probability in a shorter sample that low-resistance GBs and grains form a percolation path (i.e., a continuous network) between the electrical contacts. For large area poly-graphene (e.g., square meters, as may be used in PV applications), however, the conductance exponent approaches −1.0 with increasing length, regardless of the percentage of high-resistance GBs. As can be seen in FIG. 3, the grain shape and grain size distributions have little effect on the conductance of poly-graphene. Rather, it is the average size of the grains, $<L_{grain}>$, and the percentage of high-resistance GBs, $P_{GB}$, that dictate the overall electronic transport properties of poly-graphene.

Figure 4:
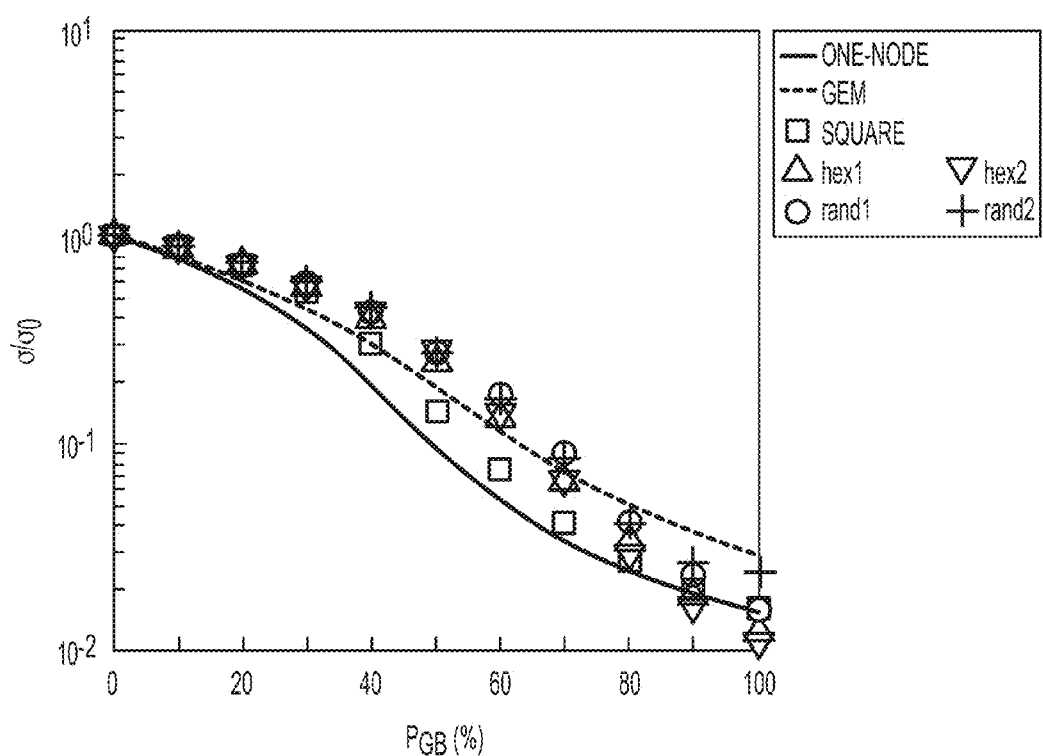
FIG. 4 is a graph of normalized conductivity for the poly-graphene microstructures of FIGS. 1A-E as a function of the percentage of high-resistance GBs, for a relatively long sample.

The dependence of the normalized conductivity, $\sigma/\sigma_0$, on the percentage of high-resistance GBs, $P_{GB}$, for a relatively long sample (e.g., $L_C \approx 100 \times <L_{grain}>$) is plotted in FIG. 4. As can be seen in FIG. 4, even small increases in the percentage of high-resistance GBs may result in dramatic suppressions of conductivity. This result may be understood with reference to FIG. 5, which interprets the resistance of a poly-graphene film as a percolation problem defined by high-resistance GBs (lines of heavier weight) and low-resistance GBs (lines of lighter weight). The percolation threshold for a Voronoi tessellation is 0.667-0.68, while the percolation threshold of a hexagonal lattice is 0.6527. Therefore, regardless of the specific form of the GB-distribution, when the percentage of high-resistance GB approaches ~0.66 (i.e., $P_{GB} \approx 66\%$), charge carriers traveling through a poly-graphene film between a pair of electrical contacts must cross one or more high-resistance GBs (the movement of the charge carriers is indicated by arrows in FIG. 5). This percolation bottleneck suppresses the conductivity of the poly-graphene film exponentially.

To confirm this percolation analysis quantitatively, the numerical results from the FDM simulation discussed above were interpreted using the generalized effective media ("GEM") theory. The GEM equation is given by:

$$f_{GB} \frac{\sigma_{GB}^{1/t} - \sigma^{1/t}}{\sigma_{GB}^{1/t} + A\sigma^{1/t}} + (1 - f_{GB}) \frac{\sigma_0^{1/t} - \sigma^{1/t}}{\sigma_0^{1/t} + A\sigma^{1/t}} = 0, \quad (1)$$

where $f_{GB}$ is area fraction of grain boundaries, $\sigma_{0(GB)}$ is the conductivity of the grain or GB, t is a characteristic exponent defined in $\sigma \propto (1-f_{GB}/f_{C,GB})^t$ (with $f_{C,GB}$ being the threshold area fraction of GBs), and the constant A is $A=f_{C,GB}/(1-f_{C,GB})$. When $\sigma_0/\sigma_{GB}=\infty$, Equation (1) may be reduced to a percolation equation: $\sigma \propto (1-f_{GB}/f_{C,GB})^t$. With t=1 and A=2, Equation (1) may also be reduced to Bruggeman's symmetric effective medium equation. To fit our simulation results, two parameters were determined: t and $f_{C,GB}$. The bounds for the critical exponent were set as 1.05 to 1.37 (typical numbers for two-dimensional bond percolation), while was adjusted to fit the data. The relationship of $f_{C,GB}$ to $P_{C,GB}$ is $P_{C,GB}=f_{C,GB}(P_{GB}^{100\%}/f_{GB}^{100\%})$, where $f_{GB}^{100\%} \sim 12.6\%$ is the area fraction of GBs when $P_{GB}$=100% (in the FDM simulation). The intensity of D bands in the spectroscopic Raman mapping of poly-graphene grains and GBs showed $f_{GB}^{100\%} \sim 10\%$. As shown by dashed line in FIG. 4, the numerical results for poly-graphene electronic transport are well-reproduced by the GEM equation when t=1.05 and $f_{C,GB}$=8.4±0.2%, corresponding to a percolation threshold of $P_{GB}$, $P_{C,GB}$=67±1.6%.

Figure 6:
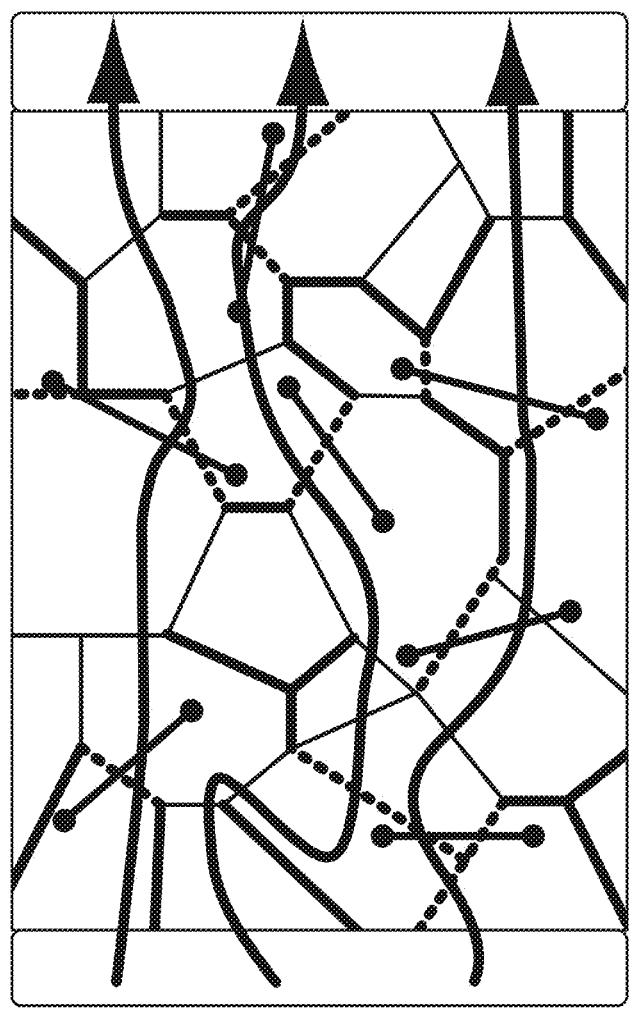
FIG. 6 illustrates the percolation of charge carriers through a poly-graphene film including high-resistance and low-resistance GBs, where the poly-graphene film has been "percolation doped" with metallic nanowires.

Based on the foregoing analysis, the sheet-resistance of poly-graphene may be reduced either by increasing grain-size or by reducing the number of high-resistance GBs. To decrease the influence of high resistance GBs, a hybrid TCM may comprise a polycrystalline film that is percolation doped with conductive nanostructures, as shown in FIG. 6. The conductive nanostructures used to percolation dope the polycrystalline film may each have a cross-sectional dimension of less than 1 µm. In the illustrative embodiment of FIG. 6, a poly-graphene film includes a sparse random dispersion of metallic NWs. These metallic NWs may comprise any suitable material, including, but not limited to, gold (Au), copper (Cu), aluminum (Al), silver (Ag), and combinations thereof. While the remainder of the disclosure will refer to an illustrative embodiment using metallic NWs, it is also contemplated that other conductive nanostructures may be used for percolation doping the polycrystalline film, including, but not limited to, CNTs and non-metallic NWs.

As illustrated in the illustrative embodiment of FIG. 6, the density of the NWs may be below a percolation threshold, so that the NWs themselves do not form a percolating network across the hybrid TCM between electrical contacts. If the average length of the NWs is larger than the average grain size, $<L_{grain}>$, the NWs will cross the GBs of the poly-graphene with probability approaching one. Where a NW intersects a high-resistance GB, that GB will no longer inhibit current conduction (as illustrated by the dashed lines in FIG. 6), so that the effective percentage of high-resistance GBs, $P_{GB}$, is reduced. Given the exponential dependence of conductivity on $P_{GB}$ (see FIG. 4), even a modest percolation-doping with NWs can dramatically decrease the sheet resistance, $R_S$, of poly-graphene films.

As one illustrative example, a poly-graphene film with an average grain-size of 5 µm may be percolation doped with a random dispersion of Ag NWs having a 100 nm diameter and an average length of 8 µm. With these dimensions, each of the Ag NWs will bridge GBs in the poly-graphene film with a probability approaching 1. The NW density ($\rho_{NW}$) may be varied between 0 to 100%, where 100% is defined as the density for which every other grain of the poly-graphene, on average, contains a NW (i.e., a NW density just below the percolation threshold). For the illustrative example where a poly-graphene film with an average grain-size of 5 µm is percolation doped with NWs having an average length of 8 µm, 100% density may correspond to the average distance between NWs being ~8-10 µm.

Figure 7:
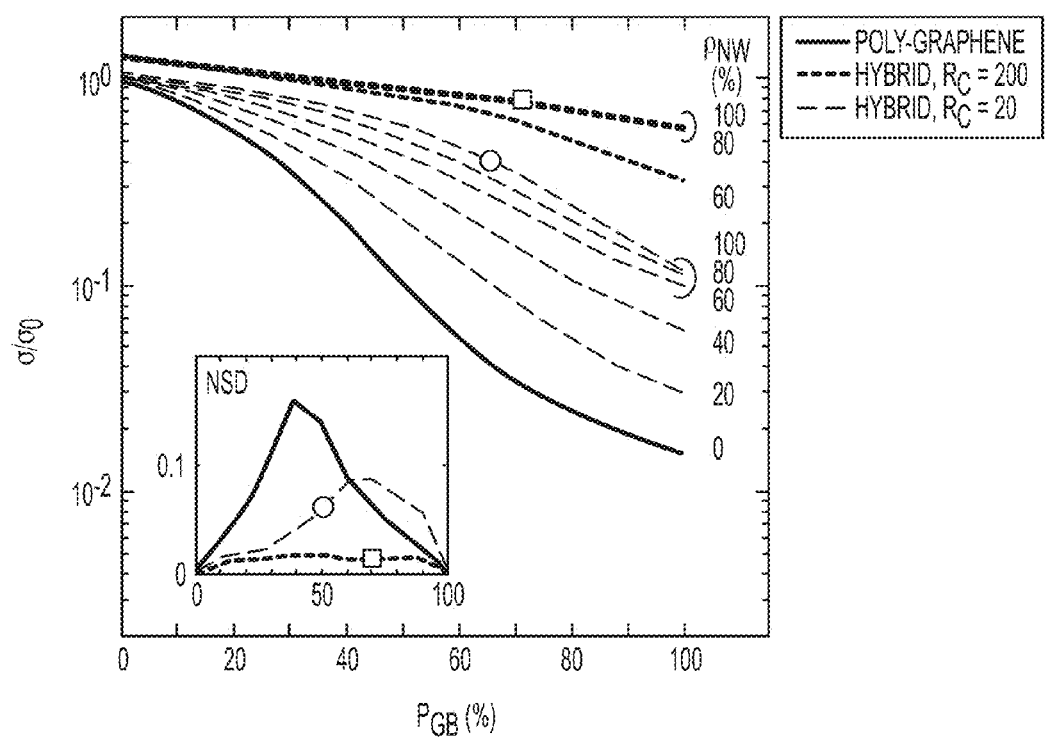
FIG. 7 is a graph of normalized conductivity for pure poly-graphene and for two hybrid TCMs as a function of the percentage of high-resistance GBs, for different NW densities.

The contact resistance, $R_c$, between metal and graphene is ~200 Ω·µm. The theoretical lower limit of $R_c$≈20 Ω·µm is obtained by assuming that the work function, W, difference between Ag and graphene is about 0.3 eV ($W_{graphene}$= 4.4~4.6 eV, $W_{Ag}$=4.7~4.9 eV). The poly-graphene conductivities discussed above remain unchanged. Using these values, a two dimensional simulation of the illustrative embodiment of a poly-graphene film percolation doped with Ag NWs was used to calculate the overall conductivity, σ, of the hybrid TCM, with the results summarized in FIG. 7. The solid line in FIG. 7 represents the normalized conductivity of pure poly-graphene (without percolation-doping by NWs, i.e., $\rho_{NW}$=0%), similar to FIG. 4. As the density of the Ag NWs is increased toward the percolation threshold (i.e., $\rho_{NW}$=100%), the normalized conductivity increases dramatically. Even with a sparse NW density of only 60% (i.e., about one NW for every four grains of poly-graphene) and relatively poor contact resistance (e.g., $R_c$≈200 Ω·µm), the sheet conductance, σ, begins to approach that of pure single crystalline graphene ($R_S$≈30 Ω/sq). The conductivity improves even further for lower contact resistance (e.g., $R_c$≈20 Ω·µm), as the quasi-percolating NWs begin to carry a larger fraction of the current between the electrical contacts of the hybrid TCM and σ reduces below 30 Ω/sq. Given the sheet resistance, $R_S^1$, of a monolayer of hybrid TCM (i.e., a poly-graphene film percolation doped with NWs), the sheet resistance of 2 or 3 layers of the hybrid TCM is obtained by $R_S^n=R_S^1/n$, where n is the number of layers. As such, a stack comprising 2-3 layers of the hybrid TCM described herein offers sheet resistance, $R_S$, approaching 10 Ω/sq, as illustrated FIG. 9.

Figure 8A:
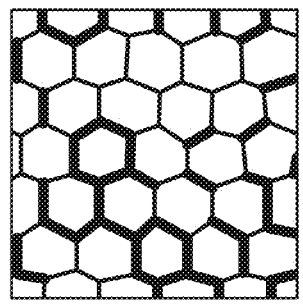
FIG. 8A illustrates one embodiment of a poly-graphene sample having perturbed hexagonal grains.
Figure 8B:
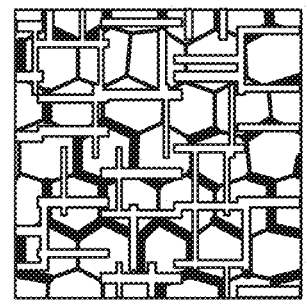
FIG. 8B illustrates a poly-graphene sample percolation doped with metallic NWs.
Figure 8C:
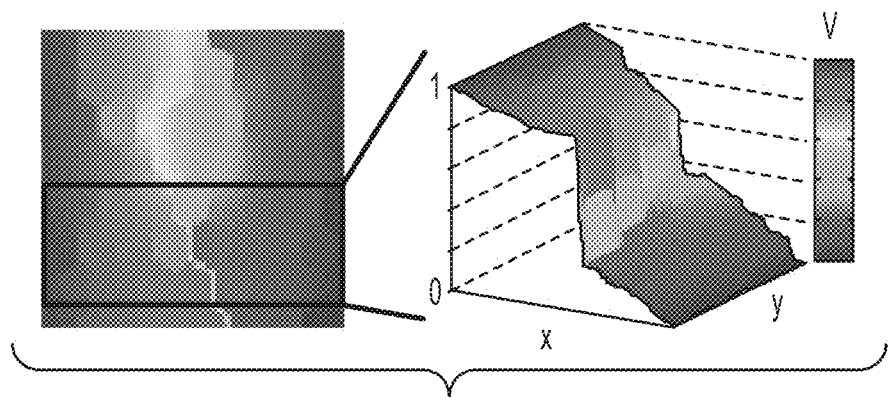
FIG. 8C illustrates a potential profile of the poly-graphene sample of FIG. 8A.
Figure 8D:
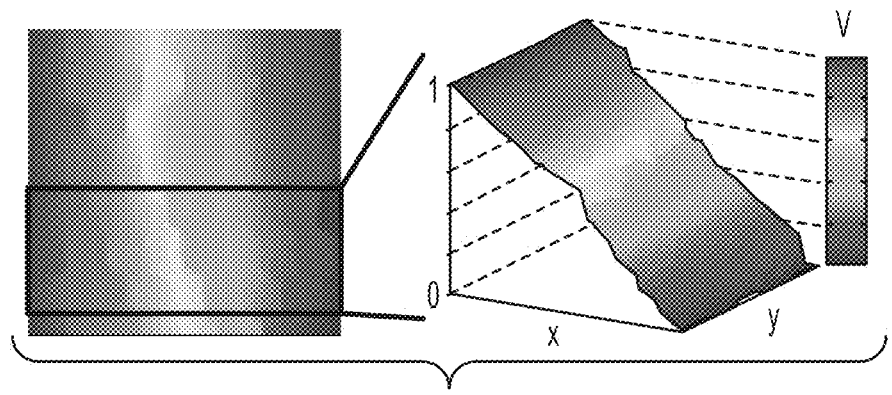
FIG. 8D illustrates a potential profile of the poly-graphene sample of FIG. 8C.

FIGS. 8A-D illustrate the effect of percolation doping with metallic NWs on the potential profile of a poly-graphene sample with $P_{GB}$≈35%. A sample of pure poly-graphene is illustrated in FIG. 8A, while its corresponding potential profile is shown in FIG. 8C. As can be seen in FIG. 8C, a sharp potential drop is observed at the high-resistance GBs for the pure poly-graphene sample. The same sample of poly-graphene, now percolation doped with metallic NWs, is illustrated in FIG. 8B, while its corresponding potential profile is shown in FIG. 8D. It will be appreciated that the density of metallic NWs is sparse enough not to form a continuous percolating path between electrical contacts. As can be seen in FIG. 8D, the impact of high-resistance GBs on the potential profile is significantly suppressed in the hybrid TCM. This occurs because the metallic NWs provide low-resistance paths to bypass high-resistance GBs.

Figure 8E:
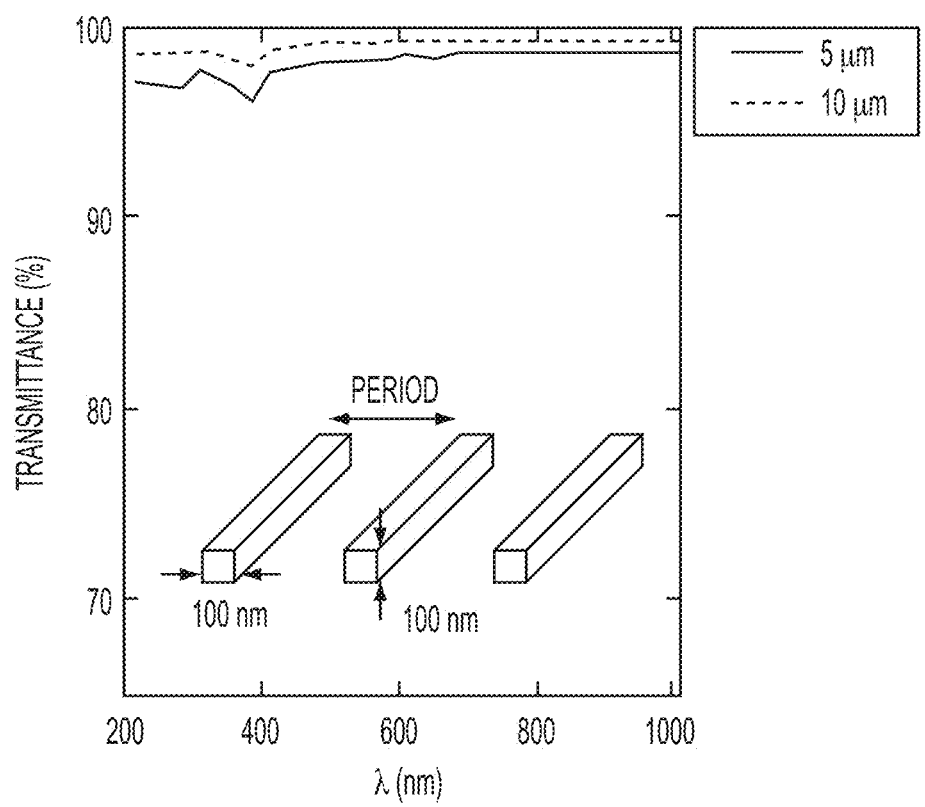
FIG. 8E is a graph of simulated transmittance as a function of incident light wavelength for a regularized network of NWs, for two different NW densities.
Figure 9:
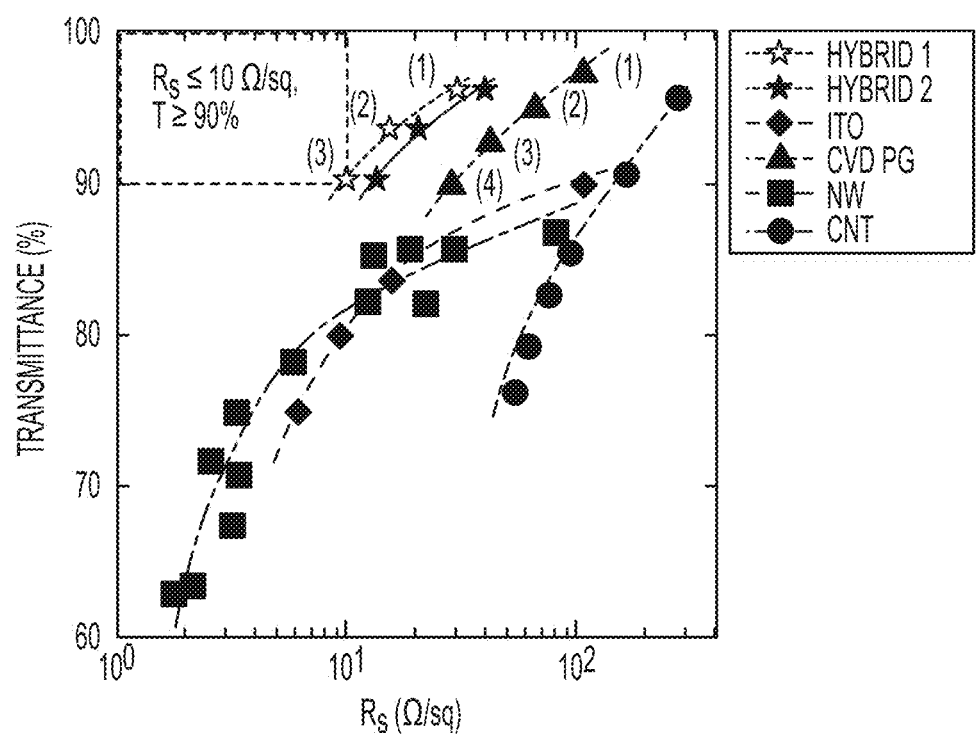
FIG. 9 is a graph of transmittance as a function of sheet resistance for illustrative embodiments of the presently disclosed hybrid TCMs, as well as various conventional TCMs.

The transmittance of the hybrid TCM described above may be calculated by solving Maxwell's equations with Floquet periodic boundary conditions. Normal illumination was assumed and the transmittance of both transverse electric and transverse magnetic modes were calculated for a set of wavelengths spanning the entire solar spectrum. For computational simplicity, the random dispersion of metallic NWs was approximated using a regularized network (i.e., identical spacing and dimensions for the metallic NWs, as shown in FIG. 8B). The simulated transmittance as a function of incident wavelength for regularized networks of NWs with a line width of 100 nm, a height of 100 nm, and a period of either 5 µm or 10 µm (corresponding to a NW density, $\rho_{NW}$, of either 100% or 50%, respectively) is plotted in FIG. 8E. The average transmittance (of the TE and TM modes) may exceed 99%, i.e., $T_{Ag}$>0.99. As the transmittance of monolayer poly-graphene is close to 97.7% as well, a hybrid TCM should achieve $T=T_{graphene} \times T_{Ag}$≈0.96. As shown in FIG. 9, even with 2-3 layers of hybrid TCM, $T=(T_{graphene} \times T_{Ag})^n$>0.90 may be obtained.

Transmittance, T, as a function of sheet resistance, $R_S$, for illustrative embodiments of the presently disclosed hybrid TCMs is plotted in FIG. 9. The numerals in brackets denote the transmittance and sheet resistance that may be achieved using 1, 2, and 3 layers of the hybrid TCMs. These values were computed as described above, using the following parameters: an $R_S$ for single crystalline graphene of ~30 Ω/sq, a ratio for inter-grain resistance to intra-grain resistance of ~63, a $P_{GB}$ of 35%, and a geometric aperture of 99% for the dispersion of metallic Ag NWs. As can be seen in FIG. 9, the presently disclosed hybrid TCM may achieve both low sheet resistance (e.g., $R_S$<10 Ω/sq) and high transmittance (e.g., T>90%). Transmittance, T, as a function of sheet resistance, $R_S$, for various conventional TCMs, including ITO, CVD poly-graphene, networks of NWs, and networks of CNTs, is also plotted in FIG. 9 for comparison. As will be appreciated by those of skill in the art, the presently disclosed hybrid TCMs surpass the transparency-conductivity limitations of pure poly-graphene films or pure CNT/NW networks.

In addition to significantly improved transmittance and sheet resistance values, the presently disclosed hybrid TCMs also exhibit reduced statistical variation in sheet resistance, as compared to pure poly-graphene films. The inset of FIG. 7 shows the normalized standard deviation ("NSD") computed for pure poly-graphene and the hybrid TCMs with $R_C \approx 200\ \Omega \cdot \mu m$ and $R_C \approx 20\ \Omega \cdot \mu m$, as a function of the percentage of high-resistance GBs, $P_{GB}$. For pure poly-graphene, the maximum NSD is about 0.15, meaning that the sheet resistance will exhibit about 15% variation among samples. The inset of FIG. 7 shows that NSD values for the hybrid TCM with $R_C \approx 200\ \Omega \cdot \mu m$ are significantly improved. For $P_{GB} \approx 35\%$, a four-fold reduction in NSD is achieved. Thus, percolation doping of poly-graphene with metallic NWs may also suppress variation in sheet resistances.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, apparatus, manufactures, and compositions described herein. It will be noted that alternative embodiments of the methods, apparatus, manufactures, and compositions of the present disclosure may not include all of the features described yet still benefit from at least some of the advantages of such features. Those of ordinary skill in the art may readily devise their own implementations of methods, apparatus, manufactures, and compositions that incorporate one or more of the features of the present invention and fall within the spirit and scope of the present disclosure.

The invention claimed is:

1. A hybrid transparent conducting material (TCM) comprising:
   a polycrystalline graphene film comprising a plurality of grains having a bulk resistivity, the plurality of grains forming a plurality of low-resistance grain boundaries and a plurality of high-resistance grain boundaries, wherein the plurality of low-resistance grain boundaries each has a resistivity that is equal to the bulk resistivity and wherein the plurality of high-resistance grain boundaries each has a resistivity that is greater than the bulk resistivity; and
   a plurality of conductive nanostructures randomly dispersed in electrical coupling with the polycrystalline graphene film, the plurality of conductive nanostructures being positioned to span across the plurality of high-resistance grain boundaries to improve electrical conductivity across the plurality of high-resistance grain boundaries;
   wherein a density of the plurality of conductive nanostructures randomly dispersed in electrical coupling with the polycrystalline graphene film is below a percolation threshold.

2. The hybrid TCM of claim 1, wherein the plurality of conductive nanostructures comprise a plurality of metallic nanowires.

3. The hybrid TCM of claim 2, wherein the plurality of metallic nanowires comprise silver nanowires.

4. The hybrid TCM of claim 1, wherein the plurality of conductive nanostructures each have a length greater than 1 μm and a cross-sectional dimension of less than 1 μm.

5. The hybrid TCM of claim 1, wherein the density of the plurality of conductive nanostructures randomly dispersed in electrical coupling with the polycrystalline graphene film is at most sixty percent of the percolation threshold.

6. A hybrid transparent conducting material (TCM) comprising:
   a polycrystalline graphene film comprising a plurality of grains having a bulk resistivity, the plurality of grains forming a plurality of low-resistance grain boundaries and a plurality of high-resistance grain boundaries, wherein the plurality of low-resistance grain boundaries each has a resistivity that is equal to the bulk resistivity and wherein the plurality of high-resistance grain boundaries each has a resistivity that is greater than the bulk resistivity; and
   a plurality of conductive nanostructures randomly dispersed in electrical coupling with the polycrystalline graphene film, the plurality of conductive nanostructures being positioned to span across the plurality of high-resistance grain boundaries to improve electrical conductivity across the plurality of high-resistance grain boundaries;
   wherein an average length of the plurality of conductive nanostructures is greater than an average grain diameter of the plurality of grains of the polycrystalline graphene film.

7. The hybrid TCM of claim 6, wherein an average distance between each of the plurality of conductive nanostructures is greater than the average length of the plurality of conductive nanostructures.

8. A hybrid transparent conducting material (TCM) comprising:
   a polycrystalline graphene film including a number of grains having a bulk resistivity, the grains forming a plurality of low-resistance grain boundaries and a plurality of high-resistance grain boundaries, wherein the plurality of low-resistance grain boundaries each has a resistivity that is equal to the bulk resistivity and wherein the plurality of high-resistance grain boundaries each has a resistivity that is greater than the bulk resistivity; and
   a number of conductive nanostructures randomly dispersed in electrical coupling with the polycrystalline graphene film, wherein the number of conductive nanostructures is less than one half the number of grains and wherein the conductive nanostructures are positioned to span across the plurality of high-resistance grain boundaries to improve electrical conductivity across the high-resistance grain boundaries.

9. The hybrid TCM of claim 8, wherein the conductive nanostructures do not form a percolating network for charge carriers across the hybrid TCM.

10. The hybrid TCM of claim 8, wherein the conductive nanostructures comprise metallic nanowires.

11. The hybrid TCM of claim 10, wherein the metallic nanowires comprise silver nanowires.

12. The hybrid TCM of claim 8, wherein an average length of the conductive nanostructures is greater than an average grain diameter of the grains of the polycrystalline graphene film.

13. The hybrid TCM of claim 8, wherein the number of conductive nanostructures is less than one fourth the number of grains.

14. The hybrid TCM of claim 6, wherein the plurality of conductive nanostructures comprise a plurality of metallic nanowires.

15. The hybrid TCM of claim 14, wherein the plurality of metallic nanowires comprise silver nanowires.

16. The hybrid TCM of claim 6, wherein the plurality of conductive nanostructures each have a length greater than 1 μm and a cross-sectional dimension of less than 1 μm.

* * * * *